United States Patent
Okamura

(10) Patent No.: US 6,911,850 B2
(45) Date of Patent: Jun. 28, 2005

(54) SEMICONDUCTOR INTEGRATED CIRCUIT

(75) Inventor: Junichi Okamura, Yokohama (JP)

(73) Assignee: Thine Electronics, Inc., Tokyo (JP)

( * ) Notice: Subject to any disclaimer, the term of this patent is extended or adjusted under 35 U.S.C. 154(b) by 19 days.

(21) Appl. No.: 10/312,882

(22) PCT Filed: May 14, 2002

(86) PCT No.: PCT/JP02/04664
§ 371 (c)(1),
(2), (4) Date: Jan. 2, 2003

(87) PCT Pub. No.: WO02/095947
PCT Pub. Date: Nov. 28, 2002

(65) Prior Publication Data
US 2004/0036087 A1 Feb. 26, 2004

(30) Foreign Application Priority Data
May 17, 2001 (JP) .................................. 2001-147185

(51) Int. Cl.⁷ ............................................ H03L 7/06
(52) U.S. Cl. ..................................... 327/141; 327/158
(58) Field of Search ...................... 527/141, 149, 527/153, 158, 156, 160, 161

(56) References Cited

U.S. PATENT DOCUMENTS 5,994,934 A * 11/1999 Yoshimura et al. ......... 327/158
6,157,263 A   12/2000 Lee et al. ..................... 331/8
6,411,142 B1 *  6/2002 Abbasi et al. ............. 327/156
6,441,662 B2 *  8/2002 Ikeda .......................... 327/160

FOREIGN PATENT DOCUMENTS

JP        2002-022524        1/2000

* cited by examiner

*Primary Examiner*—Linh My Nguyen
(74) *Attorney, Agent, or Firm*—Sughrue Mion, PLLC

(57) ABSTRACT

In a semiconductor integrated circuit including a phase comparison circuit for a DLL in a reception circuit for receiving serial digital transmission signals, phase detection characteristics of the phase comparison circuit are improved while preventing false lock so as to improve response speed and locking accuracy of the DLL as a whole. The semiconductor integrated circuit includes series-connected delay elements each having a delay time which is controlled in accordance with a control voltage, a phase comparison circuit for generating a voltage corresponding to a phase difference between a clock signal input to a predetermined one of the delay elements and a clock signal output from another predetermined one of the delay elements, a control circuit for controlling the phase comparison circuit to generate a predetermined voltage when said phase difference is within a predetermined range, and a filter circuit for filtering the voltage generated by the phase comparison circuit to generate the control voltage to be applied to the delay elements.

6 Claims, 15 Drawing Sheets

SEMICONDUCTOR INTEGRATED CIRCUIT

TECHNICAL FIELD

The present invention relates to a semiconductor integrated circuit including a phase comparison circuit for a DLL (delay-locked loop) and, more particularly, to a semiconductor integrated circuit including a phase comparison circuit for a DLL having a function of generating multi-phase clock signals used for demodulating a digital signal that is serial-transmitted.

BACKGROUND ART

In general, recent circuits for receiving high speed serial transmission signals employ a method in which serial data is sampled using multi-phase clock signals in a quantity equal to or greater than the number of symbol bits included in serialized data for each character when the reception data is demodulated. The multi-phase clock signals must be in synchronism with a transmission clock signal to be transmitted in association with the serialized data for each character, and they must have phase differences that are equal intervals associated with the intervals between the symbol bits included in the serialized data for each character.

In order to generate multi-phase clock signals having phase differences at equal intervals, such a reception circuit employs a PLL (phase-locked look) including a voltage-controlled oscillator and a phase comparison circuit or a DLL (delay-locked loop) including a voltage-controlled delay element and a phase comparison circuit.

During actual high speed serial digital transmission, so-called jitters as frequency fluctuations having a short period are generated in the serial transmission data and the transmission clock signal because of fluctuations of the power supply voltage of the transmission circuit and disturbances and so on in a transmission circuit. In a reception circuit for high speed serial digital transmission signals, multi-phase clock signals used for sampling reception data must follow up such frequency fluctuations as jitters. In general, a reception circuit utilizing a DLL is a circuit system that is desirable for generating in multi-phase clock signals in a reception circuit for high speed serial digital transmission signals because it is excellent in following up such frequency fluctuations as jitters in the transmission clock signal.

In a reception circuit utilizing a DLL, phase errors of multi-phase clock signals relative to serial transmission data are determined by phase detection characteristics of the DLL as a whole that are determined by the circuit system and performance of the phase comparison circuit forming a part of the DLL. Therefore, a phase comparison circuit for DLL used in a reception circuit for high-speed serial digital transmission must have a circuit system that provides highly accurate phase detection characteristics.

Normally, a phase comparison circuit compares the phases of two input clock signals that are a reference clock signal and a comparison clock signal and judges whether the phase of the comparison clock signal leads that of the reference clock signal or it is delayed from the same. Further, a phase comparison circuit generally operates to detect a phase difference between input clock signals in a range that is greater than $(n-1)\pi$ and smaller than $(n+1)\pi$ (n is a natural number) or in a range that is greater than $2(n-1)\pi$ and smaller than $2(n+1)\pi$ and generates a control voltage proportionate to the phase difference between the input clock signals to provide a negative feedback to a voltage-controlled delay element, thereby controlling the system. The system is designed such that the control voltage output from the phase compassion circuit is stabilized at a reference value (0V, for example) when the phase difference between the input clock signals equals $2n\pi$, and the DLL is said to be locked when the system becomes stable at the phase difference $2n\pi$ between the input clock signals.

For example, when serialized data for each character under high-speed serial digital transmission includes N symbol bits, a reception circuit that receives the serial transmission data generates multi-phase clock signals including first to (N+1)-th clock signals. Idealistically, there is a phase difference of $2\pi$ between the first clock signal and the (N+1)-th clock signal. Therefore, the number of clock signals having substantially different phases is N, and such clock signals are referred to as N-phase clock signals.

In the reception circuit utilizing a DLL, the phase of the first clock signal and the phase of the (N+1)-th clock signal are compared to control delay times of the multi-phase clock signals such that phase differences between respective adjacent two clock signals included in the multi-phase clock signals are accurately locked at 1/N times the period of the transmission clock signal.

In the case of transmission signals having a wide frequency band, the ranges of changes in the phases of the clock signals generated by the reception circuit must be similarly large. However, since phase differences equal to or greater than $4\pi$ can occur between the clock signals to be compared in the case where the phases of the clock signals change in wider ranges, measures must be taken to avoid a problem in that the phase comparison circuit locks phase differences of $2m\pi$ (m represents integers equal to or greater than 2) that are different from $2\pi$. Such a problem is referred to as false lock.

A reception circuit as shown in FIG. 1 is used to avoid that problem. FIG. 1 is a block diagram showing a conventional reception circuit for receiving high-speed serial transmission data according to a sampling method. In this case, since the number of symbol bits included in serialized data for each character is 8 bits, the reception circuit generates clock signals in eight phases as multi-phase clock signals.

A DLL 100 includes a voltage-controlled delay line 103 which outputs multi-phase clock signals $\phi_0$ to $\phi_8$ on the basis of a received transmission clock signal, a comparison clock signal generation circuit 106 which generates two types of clock signals $\phi_{04}$ and $\phi_{48}$ for phase comparison on the basis of the multi-phase clock signals $\phi_0$ to $\phi_8$, a phase comparison circuit 107 which compares the phase of the transmission clock signal and the phases of the multi-phase clock signals on the basis of the clock signals $\phi_{04}$ and $\phi_{48}$, and a filter circuit 109 which receives an output signal of the phase comparison circuit 107.

An output signal of the filter circuit 109 is applied to the voltage-controlled delay line 103 as a delay control voltage to form a control system for negative feedback. A signal delay time of the voltage-controlled delay line 103 is controlled by the delay control voltage. The filter circuit 109 is provided to adjust response characteristics of the DLL and, in general a capacity connected between a signal line and a ground potential (capacitor) is used.

In the DLL 100 shown in FIG. 1, the comparison clock signal generation circuit 106 generates the two types of clock signals $\phi_{04}$ and $\phi_{48}$ for phase comparison such that phase differences between respective adjacent two clock signals included in the multi-phase clock signals are locked at accurately ⅛ times the period of the transmission clock signal, and the phase comparison circuit 107 compares the phase of the transmission clock signal and the phases of the multi-phase clock signals on the basis of these clock signals.

A serial-parallel conversion circuit 110 converts received serial data into parallel data by sampling the serial data using the multi-phase clock signals $\phi_0$ to $\phi_7$ thus generated and by decoding the sampled serial data thereafter.

FIG. 2 is a diagram showing the phase comparison circuit for a DLL in the reception circuit as shown in FIG. 1. As shown in FIG. 2, the phase comparison circuit 107 includes an NAND circuit 301 which obtains the logical product of the clock signals $\phi_{04}$ and $\phi_{48}$ for phase comparison, an NOR circuit 302 which obtains the logical sum of the clock signals $\phi_{04}$ and $\phi_{48}$, and an output circuit 303 which generates an output signal on the basis of a phase comparison signal UP bar output from the NAND circuit 301 and a phase comparison signal DN output from the NOR circuit 302 and supplies the output signal to an output terminal 108.

FIG. 3 is a diagram showing waveforms of the multi-phase clock signals and clock signals for phase comparison in the reception circuit as shown in FIG. 1 and showing logical expressions used for generating the clock signals for phase comparison. As shown in FIG. 3, the clock signal $\phi_{04}$ for phase comparison is generated on the basis of the clock signals $\phi_0$ to $\phi_4$ included in the multi-phase clock signals, and the clock signal $\phi_{48}$ for phase comparison is generated on the basis of the clock signals $\phi_4$ to $\phi_8$ included in the multi-phase clock signals. When both of the clock signal $\phi_{04}$ and the clock signal $\phi_{48}$ are at a high level, the output signal of the NAND circuit 301 is at a low level, which results in an increase in a potential at the output terminal 108. When both of the clock signal 404 and the clock signal $\phi_{48}$ are at the low level, the output signal of the NOR circuit 302 is at the high level, which results in a decrease in the potential at the output terminal 108.

FIG. 4A is a diagram showing waveforms of the clock signals for phase comparison and the phase comparison signals when the phase of the clock signal $\phi_8$ included in the multi-phase clock signals is delayed from the state as shown in FIG. 3, and FIG. 4B is a diagram showing waveforms of the clock signals for phase comparison and the phase comparison signals when the phase of the clock signal $\phi_8$ included in the multi-phase clock signals leads the state as shown in FIG. 3.

When the phase difference between the clock signal $\phi_0$ and the clock signal $\phi_8$ included in the multi-phase clock signals is greater than $2\pi$ (360°) as shown in FIG. 4A, a capacitor of the filter circuit 109 connected to the output terminal 108 of the phase comparison circuit is charged to perform control such that the signal delay time in the voltage-controlled delay line 103 is decreased to make the phase difference equal to $2\pi$.

On the other hand, when the phase difference between the clock signal $\phi_0$ and the clock signal $\phi_8$ is smaller than $2\pi$ (360°) as shown in FIG. 4B, charges in the capacitor of the filter circuit 109 connected to the output terminal 108 of the phase comparison circuit is discharged to perform control such that the signal delay time in the voltage-controlled delay line 103 is increased to make the phase difference equal to $2\pi$. As a result, phase differences between respective adjacent two clock signals included in the multi-phase clock signals are locked at accurately ⅛ times the period of the transmission clock signal.

As apparent from the above description, the phase comparison circuit 107 used in the conventional reception circuit for high speed serial digital transmission signals as shown in FIGS. 1 to 4B compares the phases of the clock signals $\phi_4$ and $\phi_{48}$ for phase comparison generated by the comparison clock signal generation circuit 106 on the basis of the clock signals $\phi_0$ and $\phi_8$ rather than directly comparing the phases of the clock signals $\phi_0$ and $\phi_8$ included in the multi-phase clock signals generated on the voltage-controlled delay line 103.

Therefore, a phase error generated in the comparison clock signal generation circuit 106 is superposed on a comparison error that occurs in the phase comparison circuit 107, which has resulted in a problem in that the phase detection characteristics of the DLL as a whole become lower than those obtained by directly comparing the phase of the clock signals $\phi_0$ and $\phi_8$. Further, since gates of different types, i.e., the NAND circuit 301 and the NOR circuit 302, are used, timing errors occur during the operation of the gates, which has resulted in a problem in that the effect of the timing errors cannot be ignored when the phase difference between the clock signals $\phi_0$ and $\phi_8$ is close to $2\pi$ and the level of the delay control voltage is therefore low.

U.S. Pat. No. 6,157,263 discloses a phase comparison circuit for providing a fast and highly accurate PLL. FIG. 5 is a diagram showing the configuration of the phase comparison circuit for a PLL. As shown in FIG. 5, a phase comparison circuit 500 includes two dynamic D latch circuits 501 and 502, a NOR circuit 503 which supplies data to the D latch circuits 501 and 502, and inverters 504 and 505 which invert output signals of the D latch circuits 501 and 502, respectively. Each of the D latch circuits 501 and 502 has a configuration as shown in FIG. 6.

Referring again to FIG. 5, when a reset signal RS is at a low level, the D latch circuit 501 latches a signal at the low level in synchronism with a reference clock signal $\phi_{REF}$, and the D latch circuit 502 latches a signal at the low level in synchronism with a VCO clock signal $\phi_{VCO}$ output from a VCO (voltage-controlled oscillator). When an output signal UP bar of the D latch circuit 501 and an output signal DN bar of the D latch circuit 502 become the low level, the reset signal RS that is output from the NOR circuit 503 becomes a high level to reset the D latch circuits 501 and 502. The output signal UP bar from the D latch circuit 501 and the output signal DN bar from the D latch circuit 502 are inverted by inversion circuits 504 and 505 respectively to be output as phase comparison signals UP and DN.

FIG. 7 is a waveform diagram showing an operation of the phase comparison circuit as shown in FIG. 5. It shows waveforms of the reset signal RS and the phase comparison signals UP and DN that appear when the phase of the VCO clock signal $\phi_{VCO}$ shifts from the phase of the reference clock signal $\phi_{REF}$ by $2\pi$ to $4\pi$. As shown in FIG. 7, with this phase comparison circuit, it cannot be distinguished between a first case where a phase difference between the VCO clock signal $\phi_{VCO}$ and the reference clock signal $\phi_{REF}$ becomes a first integral multiple of $2\pi$ and a second case where the phase difference becomes a second integral multiple of $2\pi$. Although a phase comparison circuit having such detection characteristics effectively works for a PLL for detecting a phase difference between input clock signals in a range greater than zero and smaller than $4\pi$, it cannot be used for a DLL which is required to detect a phase difference in a wider range.

DISCLOSURE OF THE INVENTION

In view of the foregoing problem, it is an object of the present invention to improve phase detection characteristics of the phase comparison circuit while preventing false lock in a semiconductor integrated circuit including a phase comparison circuit for a DLL in a reception circuit for receiving serial digital transmission signals, thereby to improve response speed and locking accuracy of the DLL as a whole.

In order to solve the above-described problems, a semiconductor integrated circuit according to the present invention comprises a plurality of delay elements series-connected to each other, each having a delay time which is controlled in accordance with a control voltage, a phase comparison circuit for generating a voltage corresponding to a phase difference between a clock signal input to a predetermined one of the plurality of delay elements and a clock signal output from another predetermined one of the plurality of delay elements, a control circuit for controlling the phase comparison circuit to generate a predetermined voltage when said phase difference is within a predetermined range, and a filter circuit for filtering the voltage generated by the phase comparison circuit to generate the control voltage to be applied to the plurality of delay elements.

According to the present invention, a phase difference between two clock signals included in multi-phase clock signals is directly compared by the phase comparison circuit, and false lock that is likely to occur at a phase difference of 4π or more can be prevented with the control circuit, which makes it possible to improve response speed and locking accuracy of the DLL as a whole.

BRIEF DESCRIPTION OF THE DRAWINGS

Advantages and features of the present invention will become clear when the following detailed description and drawings are studied with reference to each other. In these figures, the same reference numeral represents the same component.

BEST MODE FOR CARRYING OUT THE INVENTION

Figure 8:
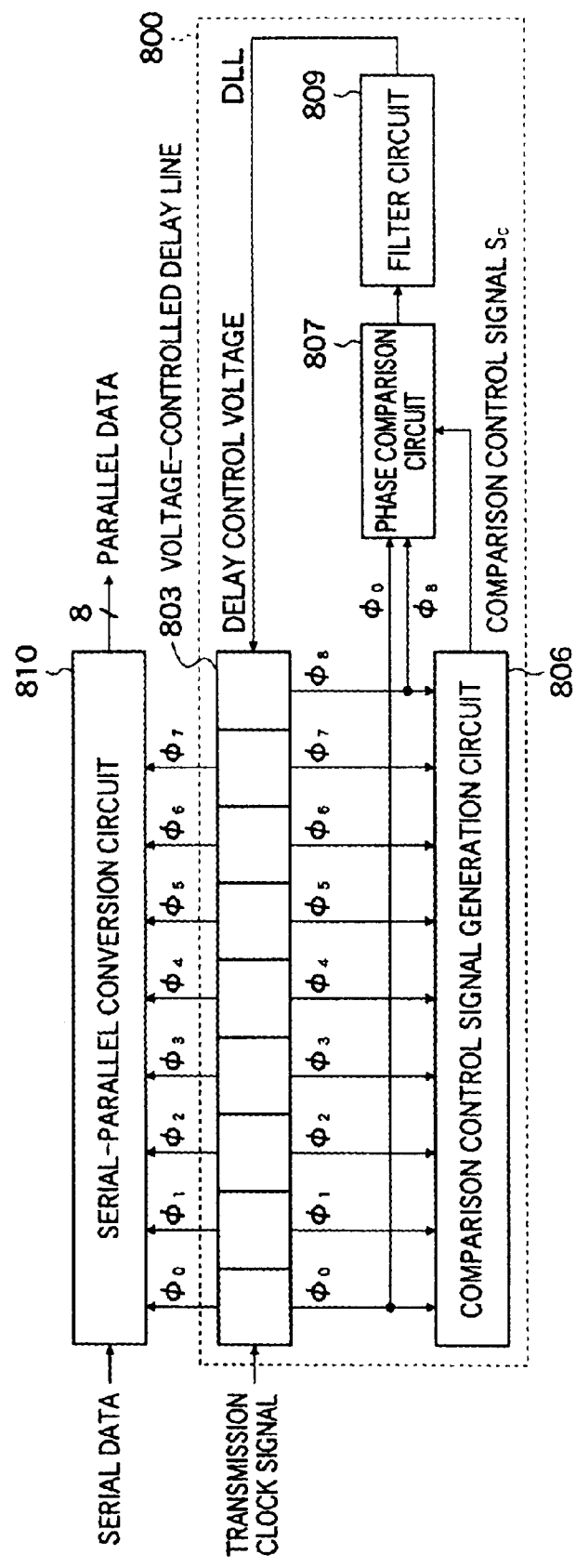
FIG. 8 is a block diagram showing a reception circuit for high-speed serial digital transmission signals included in a semiconductor integrated circuit according to a first embodiment of the present invention.

FIG. 8 is a block diagram showing a reception circuit for high-speed serial digital transmission signals included in a semiconductor integrated circuit according to a first embodiment of the present invention. The reception circuit includes a DLL 800 for generating multi-phase clock signals including first through (N+1)-th clock signals on the basis of a transmission clock signal and a serial-parallel conversion circuit 810 for converting serial data into parallel data using these multi-phase clock signals.

The DLL 800 compares a phase of the first clock signal and a phase of the (N+1)-th clock signal and controls a delay time of the multi-phase clock signals such that phase differences between respective adjacent two clock signals included in the multi-phase clock signals is locked at accurately 1/N times a period of the transmission clock signal. In this case, since the number of symbol bits included in serialized data for each character is 8, the reception circuit generates clock signals having eight phases as multi-phase clock signals.

The DLL 800 includes a voltage-controlled delay line 803 for generating multi-phase clock signals $\phi_0$ to $\phi_8$ having the same phase difference on the basis of the input transmission clock signal, a phase comparison circuit 807 for comparing a phase of the first clock signal $\phi_0$ and a phase of the ninth clock signal $\phi_8$, a comparison control signal generation circuit 806 for controlling the comparing operation of the phase comparison circuit 807, and a filter circuit 809 to which an output signal of the phase comparison circuit 807 is input.

An output signal of the filter circuit 809 is supplied to the voltage-controlled delay line 803 as a delay control voltage to form a control system of negative feedback. A signal delay time of the voltage-controlled delay line 803 is controlled by the delay control voltage. The filter circuit 809 is provided to adjust response characteristics of the DLL, and a capacitance (capacitor) connected between a signal line and a ground potential is used, for example.

The comparison control signal generation circuit 806 generates a comparison control signal on the basis of the multi-phase clock signals $\phi_0$ to $\phi_8$ to control the operation of the phase comparison circuit 807 when the phase difference between the clock signal $\phi_0$ and a clock signal $\phi_N$ exceeds a predetermined range. False lock is thus avoided.

The serial-parallel conversion circuit 810 converts input serial data into parallel data by sampling the serial data using the multi-phase clock signals $\phi_0$ to $\phi_7$ thus generated and by decoding the sampled serial data thereafter.

Figure 9:
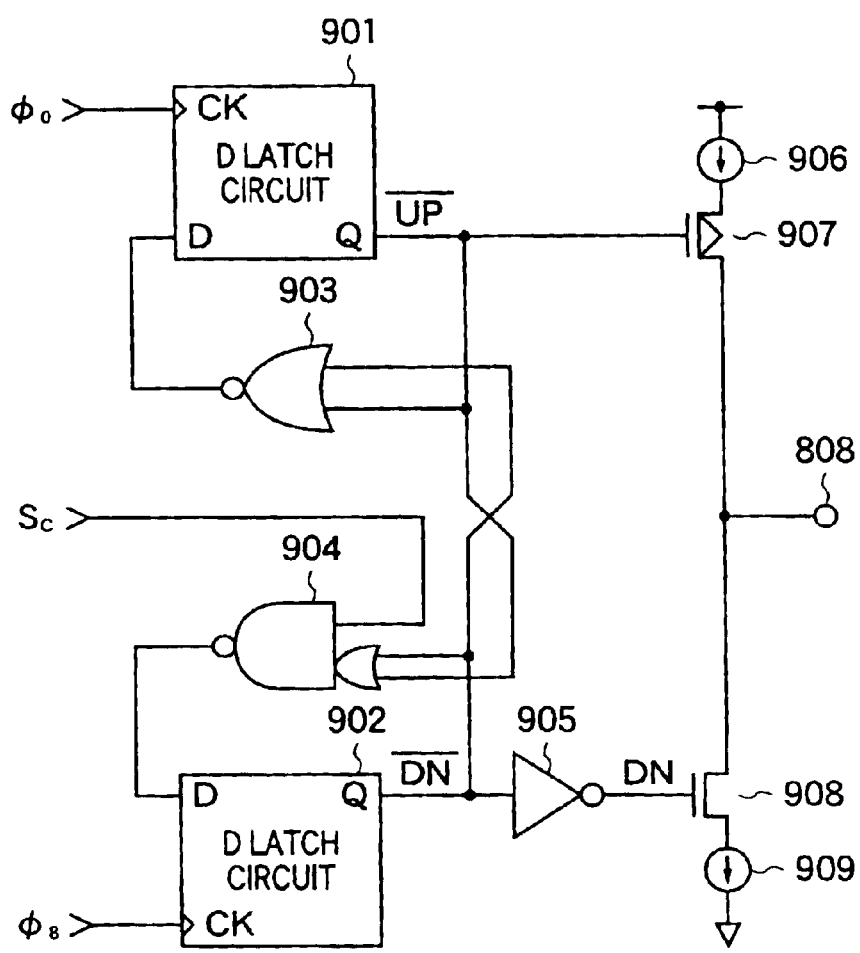
FIG. 9 is a diagram showing a configuration of a phase comparison circuit for a DLL in the reception circuit as shown in FIG. 8.

FIG. 9 is a diagram showing a configuration of the phase comparison circuit for a DLL in the reception circuit as shown in FIG. 8. The phase comparison circuit includes two dynamic D latch circuits 901 and 902, a first logic circuit 903 and a second logic circuit 904 for supplying data to the D latch circuits 901 and 902 respectively, an inverter 905 for inverting output data DN bar of the D latch circuit 902 to output inverted data (phase comparison signal) DN, a P-channel transistor 907 having a gate which is supplied with output data (phase comparison signal) UP bar of the D latch circuit 901, an N-channel transistor 908 having a gate which is supplied with a phase comparison signal DN output from the inverter 905, and current sources 906 and 909 for supplying currents to the transistors 907 and 908 respectively.

Figure 10:
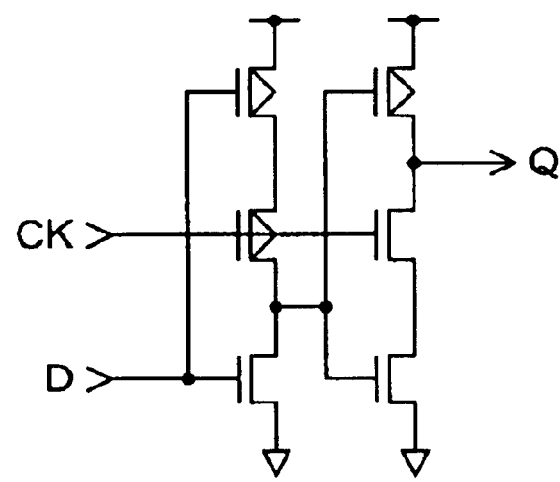
FIG. 10 is a circuit diagram showing a configuration of a dynamic D latch circuit used in the phase comparison circuit as shown in FIG. 9.

FIG. 10 is a diagram showing a configuration of a dynamic D latch circuit used in the phase comparison circuit as shown in FIG. 9. Since each of the dynamic D latch circuits 901 and 902 has a simple configuration formed by six transistors as illustrated, it can operate at a high speed. The phase comparison circuit 807 as shown in FIG. 9 can operate with high accuracy because it employs the two dynamic D latch circuits 901 and 902 having the same configuration.

As shown in FIG. 9, the first logic circuit 903 is constituted of an NOR circuit, and it supplies data at a low level to the D latch circuit 901 when the output data UP bar of the D latch circuit 901 or the output data DN bar of the D latch circuit 902 is at a high level. The D latch circuit 901 sets output data thereof at the low level in the case where the first clock signal $\phi_0$ rises when input data is at the low level. When the input data becomes the high level thereafter, the D latch circuit 901 is reset so that the output data is set at the high level.

The second logic circuit 904 is a combination of an OR circuit and an NAND circuit and is designed such that each input signal passes through transistors in the same quantity as that in the first logic circuit 903. Therefore, a delay time added to each input signal is also substantially equal to that in the first logic circuit 903.

The second logic circuit 904 supplies data at the low level to the D latch circuit 902 when a comparison signal $S_C$ is at the high level and the output data UP bar of the D latch circuit 901 or the output data DN bar of the D latch circuit 902 is at the high level. The D latch circuit 902 sets output data thereof at the low level in the case where the ninth clock signal $\phi_8$ rises when input data is at the low level. When the input data becomes the high level thereafter, the D latch circuit 902 is reset so that the output data is set at the high level.

Further, the second logic circuit 904 can control the D latch circuit 902 individually in accordance with the comparison control signal $S_C$. Specifically, the second logic circuit 904 sets the output signal thereof at the high level when the comparison signal $S_C$ is at the low level. As a result, the D latch circuit 902 is reset to keep output data thereof at the high level, and the phase comparison signal DN output from the inverter 905 is kept at the low level. From this time on, the dynamic D latch circuit 901 will not be reset, and the output data UP bar thereof will be kept at the low level.

Figure 11:
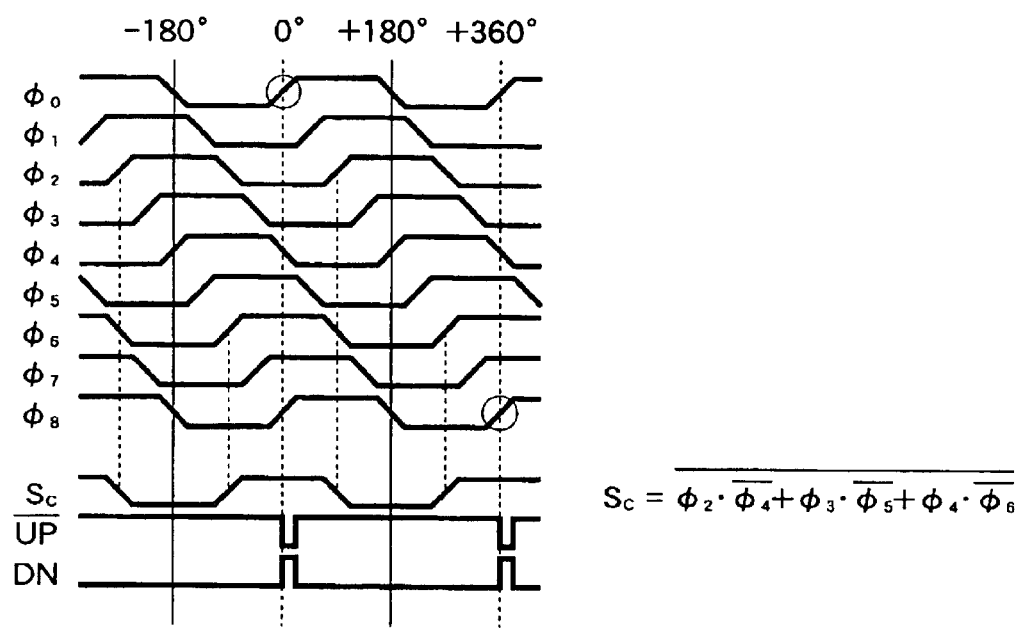
FIG. 11 is a diagram showing waveforms of multi-phase clock signals, a comparison control signal, and phase comparison signals in the reception circuit as shown in FIG. 8 and showing a logical expression used for generating the comparison control signal.

FIG. 11 is a diagram showing waveforms of the multi-phase clock signals, the comparison control signal, and the phase comparison signals in the reception circuit as shown in FIG. 8 and showing a logical expression used for generating the comparison control signal. Although the phase comparison signal UP bar is temporarily set at the low level at a rise of the clock signal $\phi_0$, it will be reset to the high level again because the output signal of the first logic circuit 903 soon becomes the high level. Although the phase comparison signal DN is temporarily set at the high level at a rise of the clock signal $\phi_8$, it will be reset to the low level again because the output signal of the second logic circuit 904 soon becomes the high level.

The comparison control signal $S_C$ is generated on the basis of the clock signals $\phi_2$ to $\phi_6$ included in the multi-phase clock signals. When the phase difference between the clock signals $\phi_0$ and $\phi_8$ included in the multi-phase clock signals is close to $2\pi$ (360°) as shown in FIG. 11, the comparison control signal $S_C$ has no influence on the operation of the phase comparison circuit.

Figure 12A:
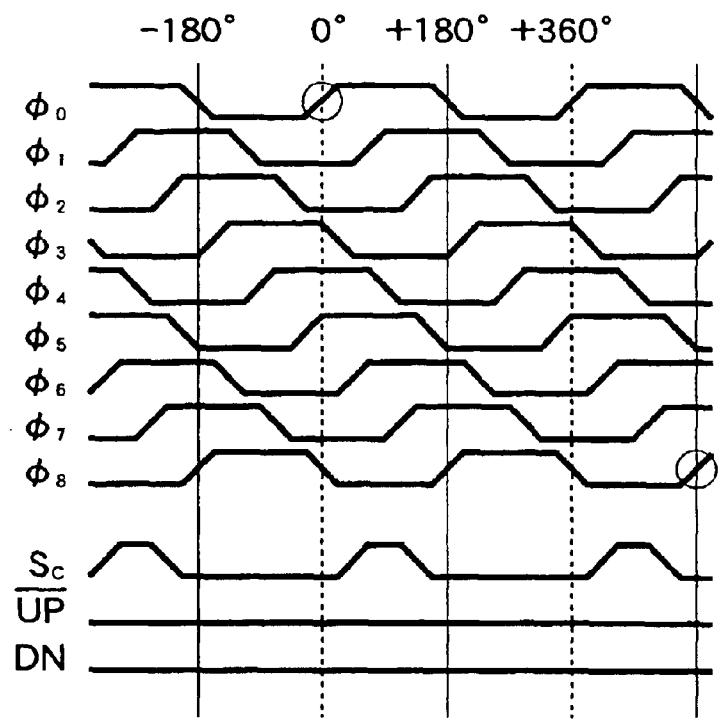
FIG. 12A is a diagram showing waveforms of the comparison control signal and the phased comparison signals that appear when the phase of a clock signal is delayed.
Figure 12B:
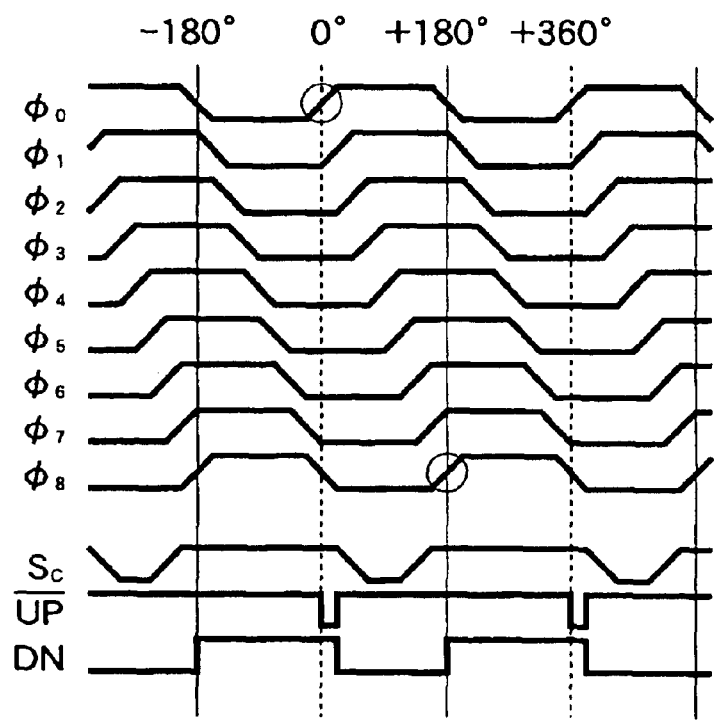
FIG. 12B is a diagram showing waveforms of the comparison control signal and the phased comparison signals that appear when the phase of the clock signal leads, in the reception circuit as shown in FIG. 8.

FIG. 12A is a diagram showing waveforms of the comparison control signal and the phase comparison signals that appear when the phase of the clock signal $\phi_8$ included in the multi-phase clock signals is delayed from the state as shown in FIG. 11 in the reception circuit as shown in FIG. 8, and FIG. 12B is a diagram showing waveforms of the comparison control signal and the phase comparison signals that appear when the phase of the clock signal $\phi_8$ leads the state as shown in FIG. 11 in the reception circuit as shown in FIG. 8.

In the case where the phase difference between the clock signal $\phi_0$ and the clock signal $\phi_8$ is greater than $2\pi$ (360°) and in a predetermined range as shown in FIG. 12A, the comparison control signal $S_C$ becomes the low level. As a result, the phase comparison signal DN always stays at the low level, and the phase comparison signal UP bar is kept at the low level without being reset. Therefore, the transistor 907 as shown in FIG. 9 is turned on and the transistor 908 is turned off to increase a voltage at an output terminal 808, whereby control is performed to decrease the signal delay time of the voltage-controlled delay line 803 (FIG. 8) until the phase difference equals $2\pi$.

Figure 1:
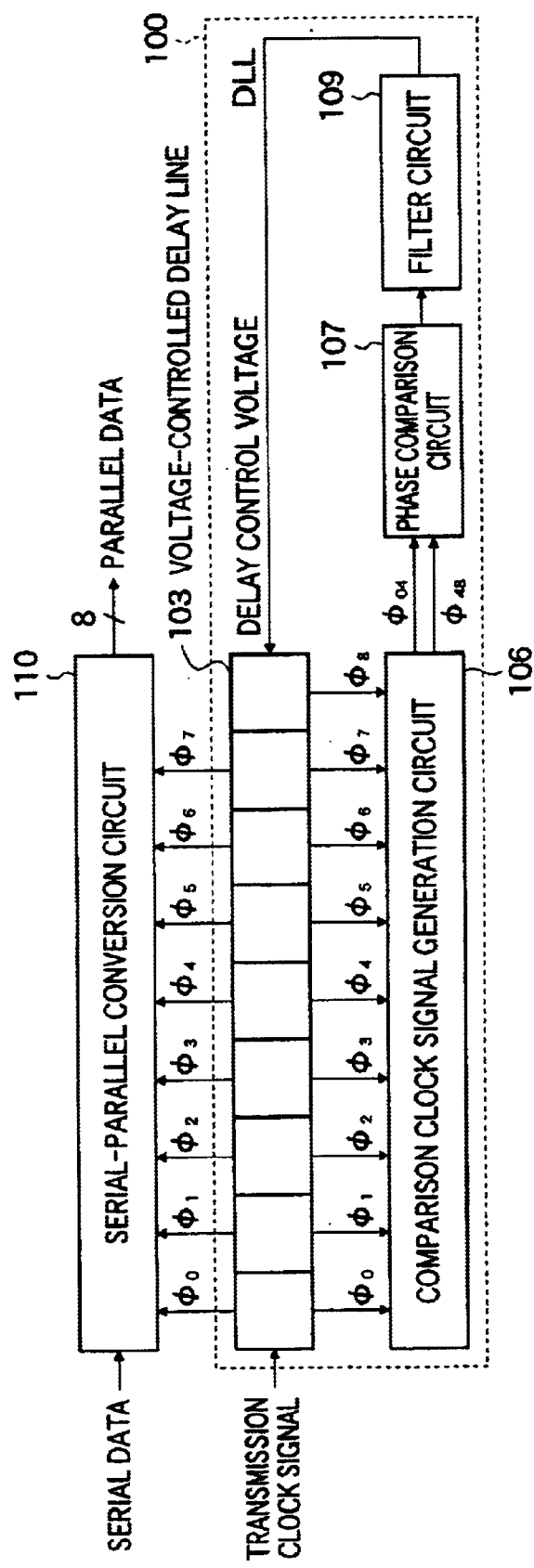
FIG. 1 is a block diagram showing a conventional reception circuit.
Figure 2:
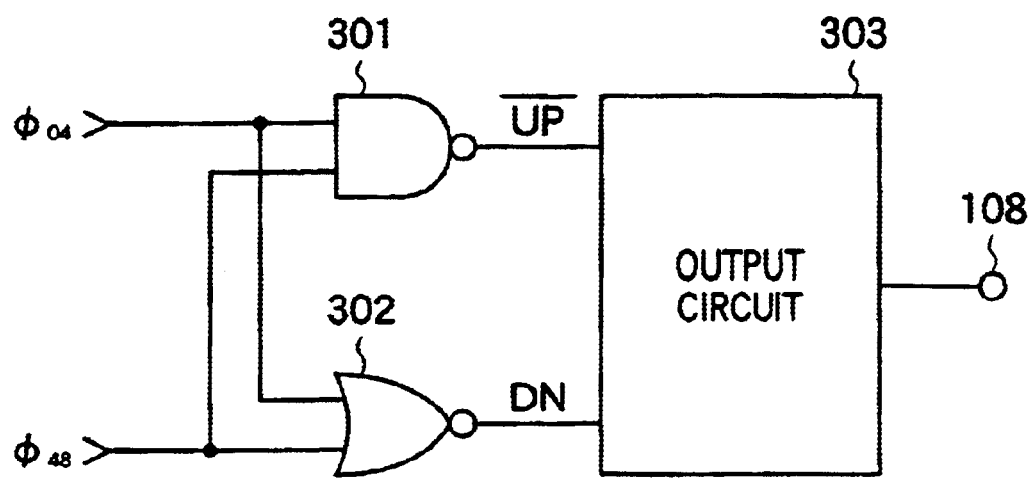
FIG. 2 is a diagram showing a phase comparison circuit for a DLL in the reception circuit as shown in FIG. 1.
Figure 3:
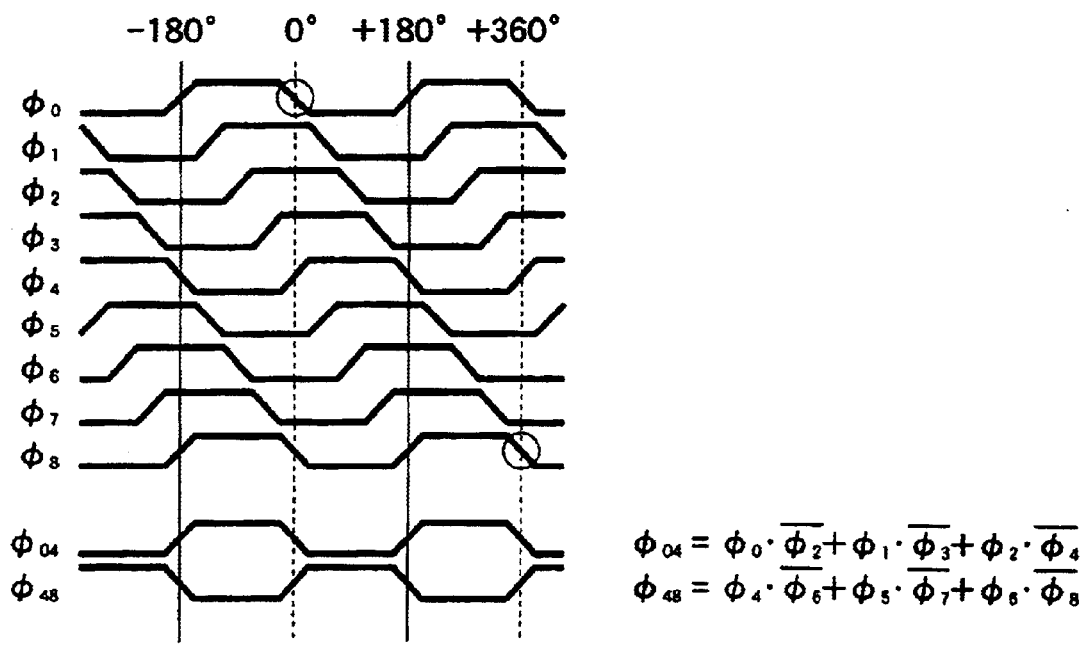
FIG. 3 is a diagram showing waveforms of multi-phase clock signals and clock signals for phase comparison in the reception circuit as shown in FIG. 1 and showing logical expressions used for generating the clock signals for phase comparison.
Figure 4A:
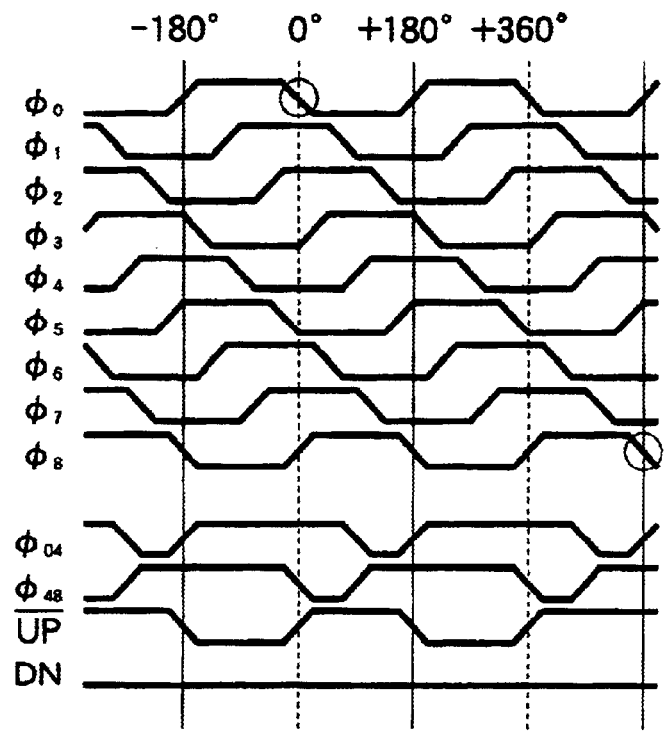
FIG. 4A is a diagram showing waveforms of the clock signals for phase comparison and phase comparison signals that appear when the phase of a clock signal is delayed.
Figure 4B:
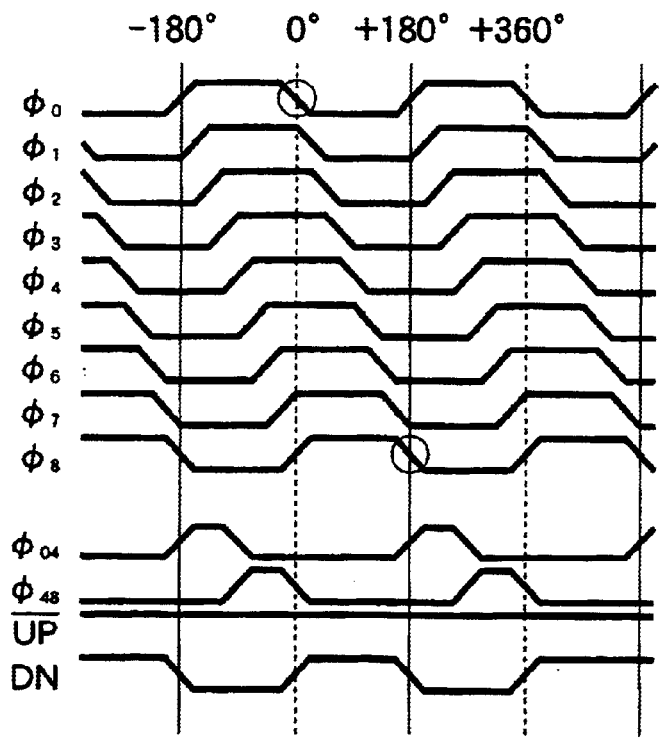
FIG. 4B is a diagram showing waveforms of the clock signals for phase comparison and the phase comparison signals when the phase of the clock signal leads.
Figure 5:
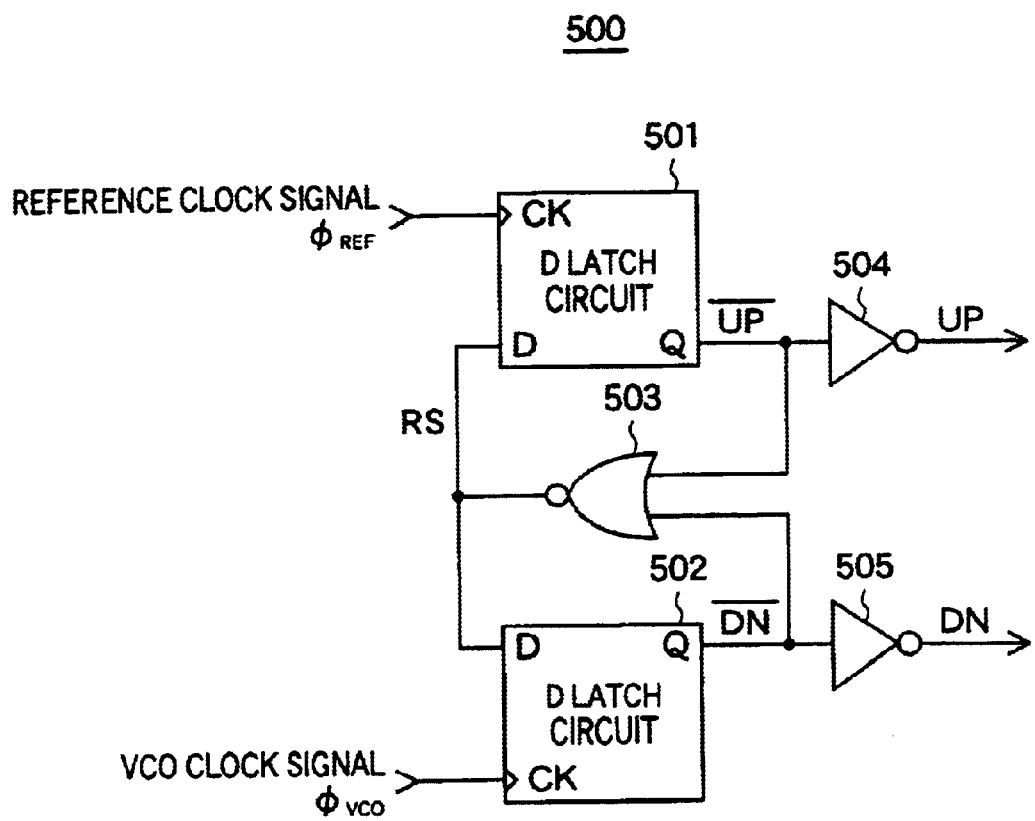
FIG. 5 is a block diagram showing a configuration of a conventional phase comparison circuit for a PLL.
Figure 6:
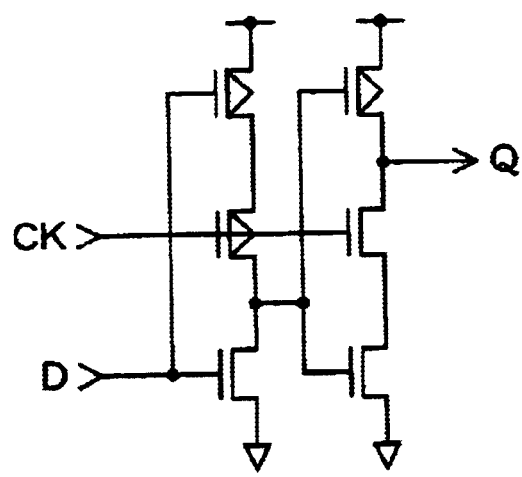
FIG. 6 is a circuit diagram showing a configuration of a dynamic D latch circuit used in the phase comparison circuit as shown in FIG. 5.
Figure 7:
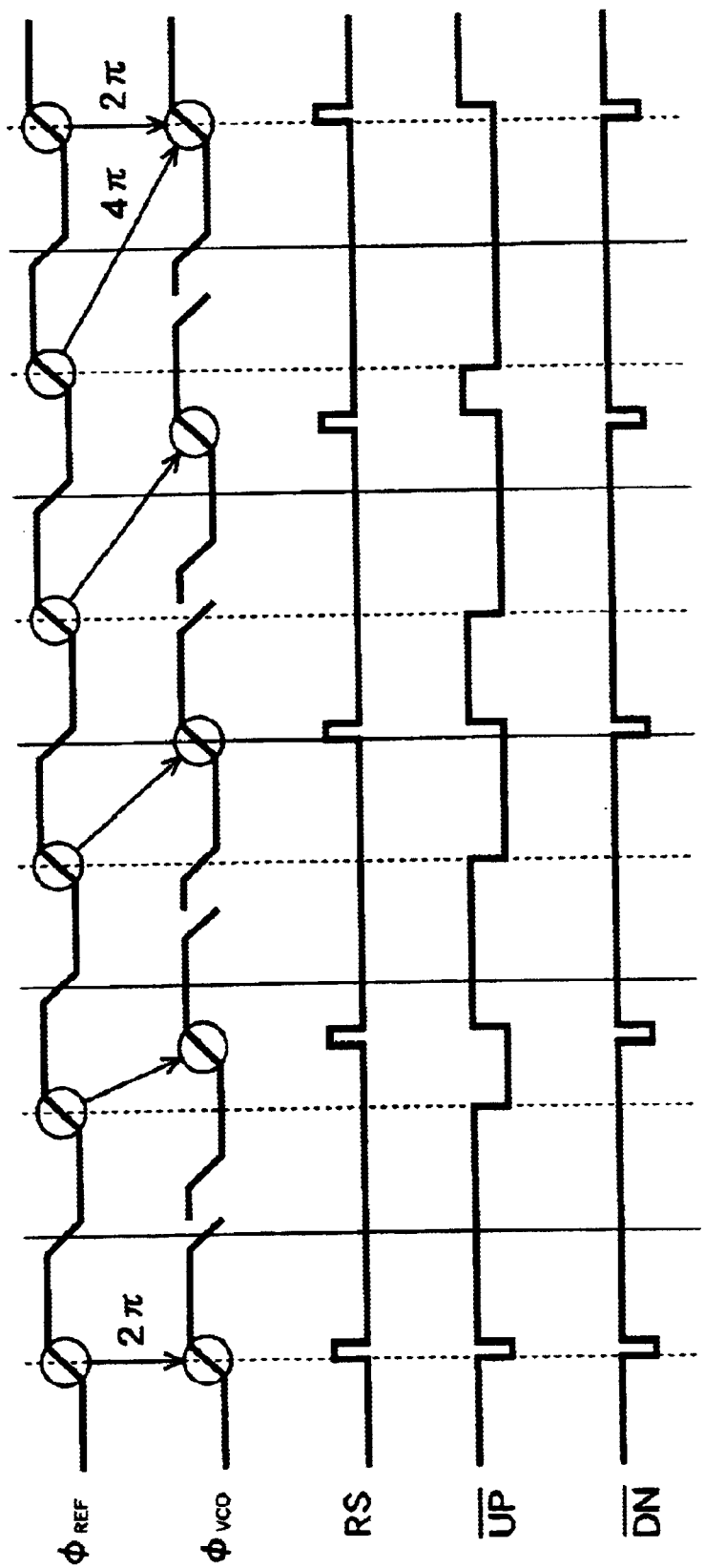
FIG. 7 is a waveform diagram showing an operation of the phase comparison circuit as shown in FIG. 5.

In the phase comparison circuit as shown in FIG. 5, when the phase difference between the clock signal $\phi_0$ and the clock signal $\phi_8$ becomes $4\pi$, a phase difference that is smaller than the actual phase difference by $2\pi$ is detected. In the present embodiment, however, even when the phase difference between the clock signals $\phi_0$ and $\phi_8$ becomes $4\pi$ or more, the control system operates to decrease the phase difference because the phase comparison signals UP bar and DN are kept at the low level.

In the case where the phase difference between the clock signal $\phi_0$ and the clock signal $\phi_8$ is smaller than $2\pi$ (360°) as shown in FIG. 12B, the phase comparison signal DN is set at the high level at a rise of the clock signal $\phi_8$ and the phase comparison signal DN is reset to the low level immediately after a rise of the clock signal $\phi_0$, in the same way as the prior art. In a period during which the phase comparison signals UP bar and DN are at the high level, the transistor 907 as shown in FIG. 9 is turned off and the transistor 908 is turned on to decrease the voltage at the output terminal 808, whereby control is performed to increase the signal delay time of the voltage-controlled delay line 803 (FIG. 8) until the phase difference equals $2\pi$. Since the signal delay time of the voltage-controlled delay line 803 can never become zero normally, there is no concern about false lock that is caused by zero phase difference between the clock signal $\phi_0$ and the clock signal $\phi_8$.

As described above, in the present embodiment, a rising edge of the clock signal $\phi_0$ and a rising edge of the clock signal $\phi_8$ can be directly compared to lock the DLL such that phase differences between respective two adjacent clock signals included in the multi-phase clock signals become exactly 1/N times the period of the transmission clock signal. Therefore, there is no superposition of a phase error of a comparison clock signal generation circuit on a comparison error at a phase comparison circuit that has been a problem with the prior art, and phase detection characteristics of a DLL as a whole can be thus improved.

Next, a second embodiment of the present invention will now be described.

Figure 13:
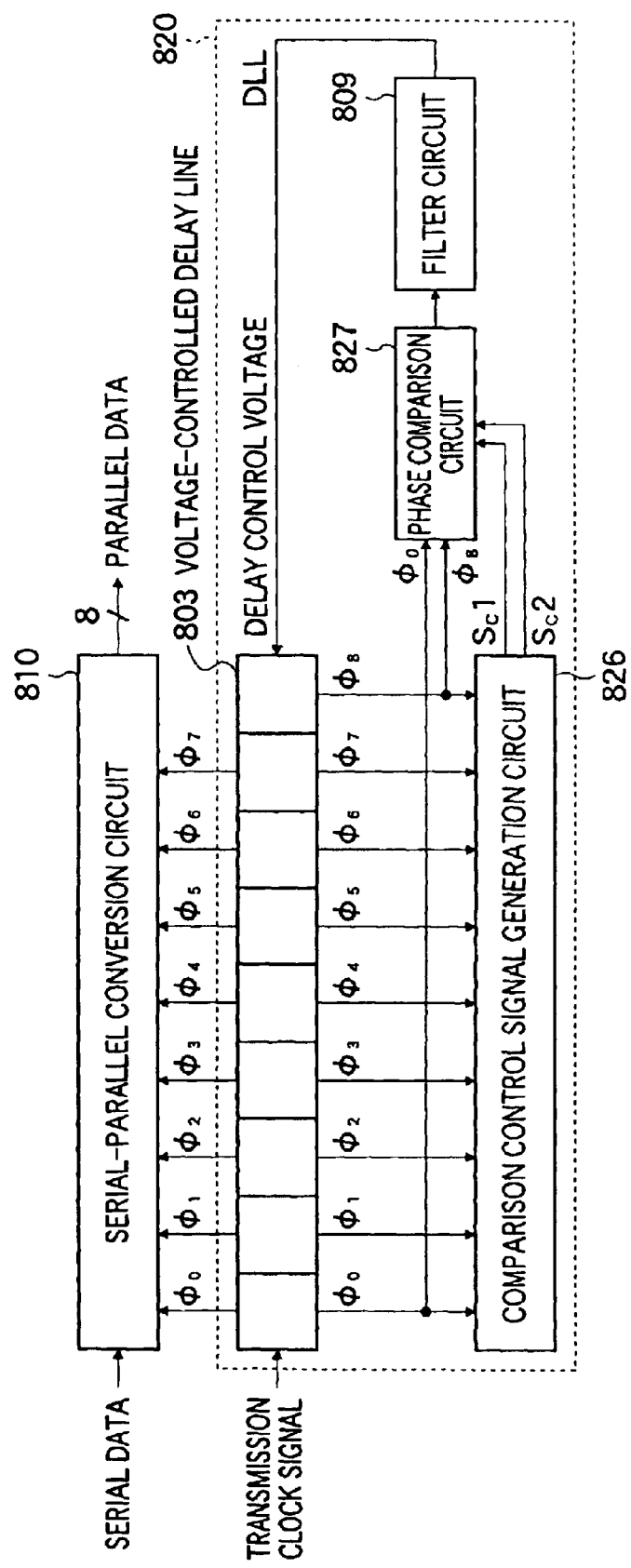
FIG. 13 is a block diagram showing a reception circuit for high-speed serial digital transmission signals included in a semiconductor integrated circuit according to a second embodiment of the present invention.

FIG. 13 is a block diagram showing a reception circuit for high-speed serial digital transmission signals included in a semiconductor integrated circuit according to a second embodiment of the present invention. In the present embodiment, a comparison control signal generation circuit 826 generates a first comparison control signal $S_C1$ and a second comparison control signal $S_C2$, and a phase comparison circuit 827 compares a phase of the clock signal $\phi_0$ and a phase of the clock signal $\phi_8$ according to the first comparison control signal $S_C1$ and the second comparison control signal $S_C2$. The embodiment is otherwise similar to the first embodiment.

Figure 14:
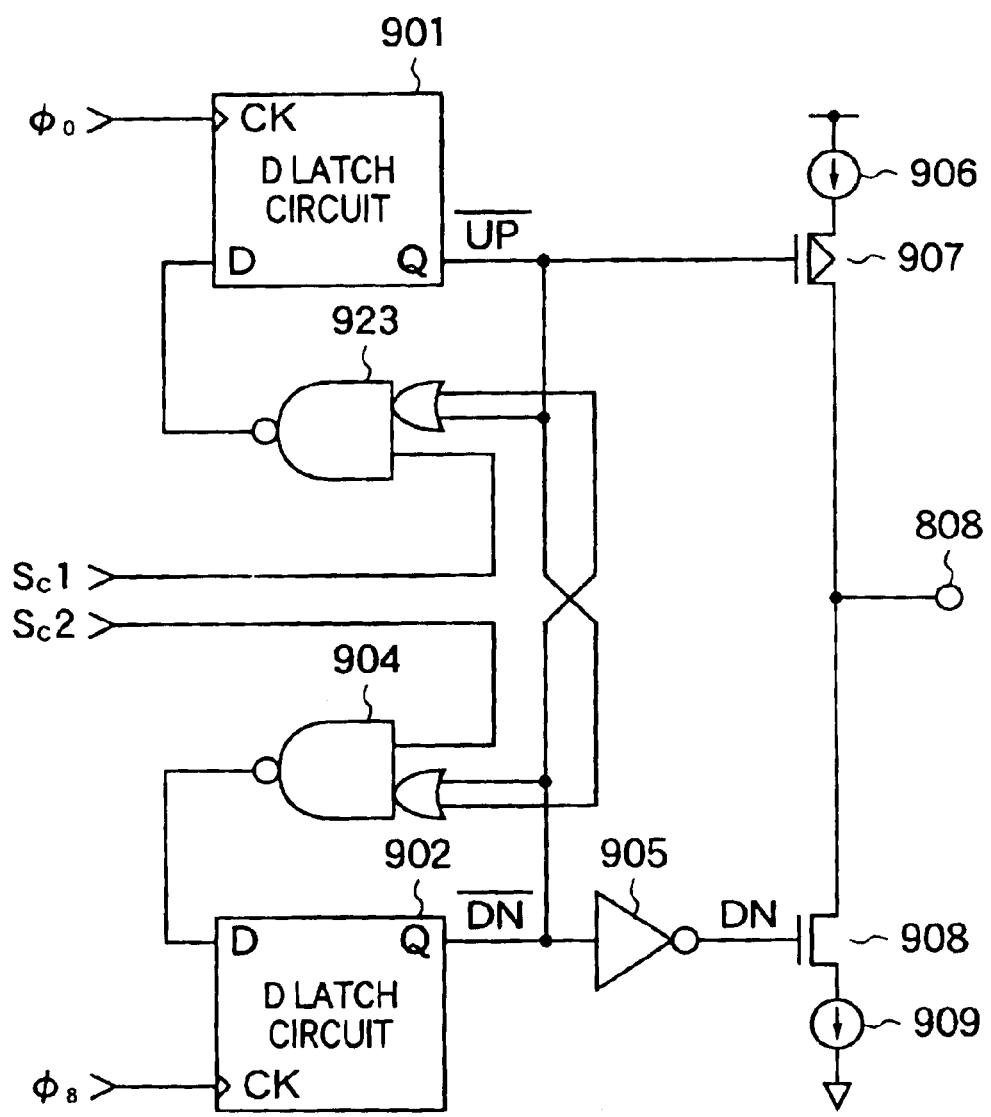
FIG. 14 is a diagram showing a configuration of a phase comparison circuit for a DLL in the reception circuit as shown in FIG. 13.

FIG. 14 is a diagram showing a configuration of a phase comparison circuit for a DLL in the reception circuit as shown in FIG. 13. The phase comparison circuit includes two dynamic D latch circuits 901 and 902, a first logic circuit 923 and a second logic circuit 904 for resetting the D latch circuits 901 and 902 respectively, an inverter 905 for inverting an output signal DN bar of the D latch circuit 902 to output an inverted signal (phase comparison signal) DN, a P-channel transistor 907 having a gate which is supplied with an output signal (phase comparison signal) UP bar of the D latch circuit 901, an N-channel transistor 908 having a gate which is supplied with a phase comparison signal DN output from the inverter 905, and current sources 906 and 909 for supplying currents to the transistors 907 and 908.

The first logic circuit 923 is a combination of an OR circuit and an NAND circuit similar to the second logic circuit 904. The first logic circuit 923 supplies data at a low level to the D latch circuit 901 when the first comparison control signal $S_C1$ is at a high level and the phase comparison signal UP bar or the phase comparison signal DN bar is at the high level. The D latch circuit 901 sets output data thereof at the low level in the case where the first clock signal $\phi_0$ rises when input data is at the low level. When the input data becomes the high level thereafter, the D latch circuit 901 is reset so that the output data is set at the high level.

The second logic circuit 904 supplies data at the low level to the D latch circuit 902 when the second comparison control signal $S_C2$ is at the high level and the phase comparison signal UP bar or the phase comparison signal DN bar is at the high level. The D latch circuit 902 sets output data thereof at the low level in the case where the ninth clock signal $\phi_8$ rises when input data is at the low level. When the input data becomes the high level thereafter, the D latch circuit 902 is reset so that the output data is set at the high level.

Further, the first logic circuit 923 and the second logic circuit 904 can respectively control the dynamic D latch circuits 901 and 902 individually in accordance with the first and second comparison control signals $S_C1$ and $S_C2$.

When the phase difference between the clock signal $\phi_0$ and the clock signal $\phi_8$ is smaller than $2\pi$ and is in a first predetermined range, the first comparison control signal $S_C1$ becomes the low level, and the first logic circuit 923 sets the output signal thereof at the high level. As a result, the phase comparison signal UP bar output from the D latch circuit 901 is reset and kept at the high level. The output signal DN bar of the D latch circuit 902 is kept at the low level without being reset, and the phase comparison signal DN output from the inverter 905 is kept at the high level. Therefore, the transistor 907 as shown in FIG. 14 is turned off and the transistor 908 is turned on to decrease a voltage at an output terminal 808, whereby control is performed to increase a signal delay time of a voltage-controlled delay line 803 (FIG. 13) until the phase difference equals $2\pi$.

When the phase difference between the clock signal $\phi_0$ and the clock signal $\phi_8$ is greater than $2\pi$ and is in a second predetermined range, on the other hand, the second comparison control signal $S_C2$ becomes the low level, and the second logic circuit 903 sets the output signal thereof at the high level. As a result, the phase comparison signal DN bar output from the D latch circuit 902 is reset and kept at the high level, and the phase comparison signal DN output from the inverter 905 is kept at the low level. The phase comparison signal UP bar output from the D latch circuit 901 is kept at the low level without being reset. Therefore, the transistor 907 as shown in FIG. 14 is turned on and the transistor 908 is turned off to increase the voltage at the output terminal 808, whereby control is performed to decrease the signal delay time of the voltage-controlled delay line 803 (FIG. 13) until the phase difference equals $2\pi$.

Figure 15:
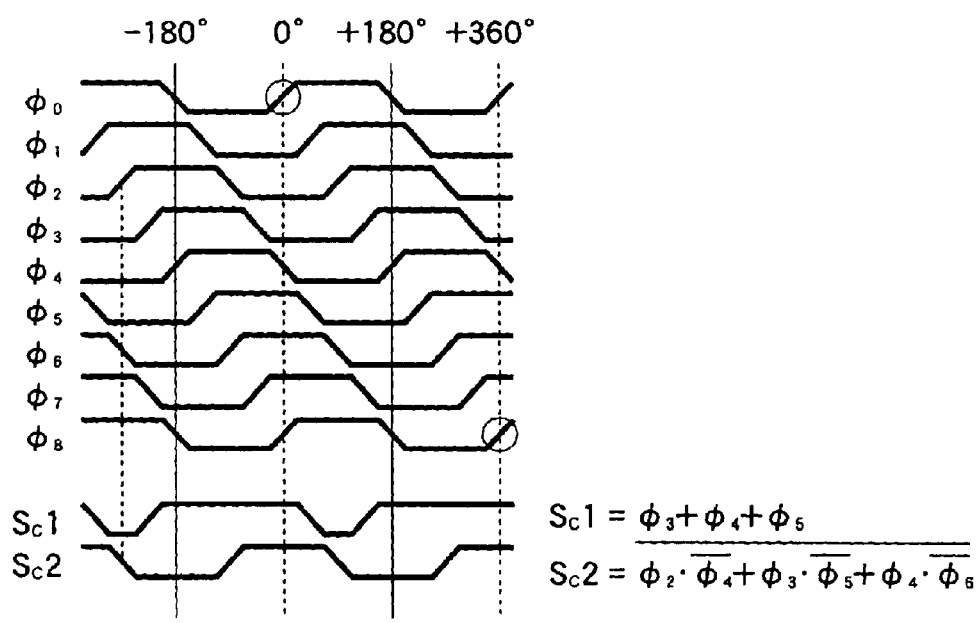
FIG. 15 is a diagram showing waveforms of multi-phase clock signals and comparison control signals in the reception circuit as shown in FIG. 13 and showing logical expressions used for generating the comparison control signals.

FIG. 15 is a diagram showing waveforms of the multi-phase clock signals and comparison control signals in the reception circuit as shown in FIG. 13 and showing logical expressions used for generating the comparison control signals. The first comparison control signal $S_C1$ is generated on the basis of the clock signals $\phi_3$ to $\phi_5$ included in the multi-phase clock signals. The second comparison control signal $S_C2$ is generated on the basis of the clock signals $\phi_2$ to $\phi_6$ included in the multi-phase clock signals. When the phase difference between the clock signals $\phi_0$ and $\phi_8$ included in the multi-phase clock signals is close to $2\pi$ as shown in FIG. 15, the first comparison control signal $S_C1$ and the second comparison control signal $S_C2$ have no influence of the operation of the phase comparison circuit.

In the second embodiment of the present invention as shown in FIGS. 13 to 15, since a range for controlling the phase comparison operation using the comparison control signals is provided in the direction in which the phase difference between the clock signals $\phi_0$ and $\phi_8$ decreases (on a phase lead side) as well as the direction in which the phase difference increases (on a phase lag side), false lock can be reliably prevented even in a reception circuit in which false lock may otherwise occur in the direction of decreasing a phase difference.

In a reception circuit for high-speed serial digital transmission signals, the use of a semiconductor integrated circuit according to the present invention makes it possible to provide a multi-phase clock signal generation circuit that excellently follows up jitters even when jitters are caused in the transmission clock signal by fluctuations of the power supply voltage of the transmission circuit, disturbances to the transmission line and so on, which allows phase detection characteristics of the DLL as a whole to be significantly improved.

While the present invention has been described above on the basis of some embodiments, the present invention is not limited to the above-described embodiments and may be freely modified and altered within the scope set forth in the claims. Although the advantages of the present invention have been described with reference to particular dynamic D latch circuits that constitute a phase comparison circuit for example, the present invention is advantageous and practical also when other dynamic D latch circuits operating similarly are used.

Industrial Applicability

The invention can be utilized in a DLL for generating multi-phase clock signals to be used for decoding digital signals under serial transmission.

What is claimed is:

1. A semiconductor integrated circuit comprising:
   a delay circuit including a plurality of delay elements series-connected to each other, each having a delay time which is controlled in accordance with a voltage;
   a phase comparison circuit for comparing a phase of an m-th clock signal and a phase of an (m+N)th clock signal in said delay circuit to obtain a phase difference, where m is not less than 1 and N is not less than 1;
   a comparison control signal generating circuit for generating a comparison control signal so as to control said phase comparison circuit to generate a predetermined voltage when said phase difference between the phase of said m-th clock signal and the phase of said (m+N)th clock signal exceeds a predetermined range; and
   a filter circuit for filtering a voltage generated by said phase comparison circuit and applying said filtered voltage to said plurality of delay elements of said delay circuit.

2. A semiconductor integrated circuit comprising:
   a delay circuit including a plurality of delay elements series-connected to each other, each having a delay time which is controlled in accordance with a voltage;
   a phase comparison circuit for comparing a phase of a clock signal and a phase of another clock signal in said delay circuit to obtain a phase difference;
   a comparison control signal generating circuit for generating a comparison control signal so as to control said phase comparison circuit to generate a predetermined voltage when said phase difference between the phase of said clock signal and the phase of and said another clock signal exceeds a predetermined range; and
   a filter circuit for filtering a voltage generated by said phase comparison circuit and applying said filtered voltage to said plurality of delay elements of said delay circuit;
   wherein said comparison control signal generating circuit controls said phase comparison circuit to generate a first predetermined voltage when said phase difference is smaller than $2\pi$ and within a first predetermined range and to generate a second predetermined voltage when said phase difference is greater than $2\pi$ and within a second predetermined range.

3. A semiconductor integrated circuit comprising:
   a delay circuit including a plurality of delay elements series-connected to each other, each having a delay time which is controlled in accordance with a voltage;
   a phase comparison circuit for comparing a phase of a clock signal and a phase of another clock signal in said delay circuit to obtain a phase difference;
   a comparison control signal generating circuit for generating a comparison control signal so as to control said phase comparison circuit to generate a predetermined voltage when said phase difference between the phase of said clock signal and the phase of said another clock signal exceeds a predetermined range; and
   a filter circuit for filtering a voltage generated by said phase comparison circuit and applying said filtered voltage to said plurality of delay elements of said delay circuit;
   wherein said phase comparison circuit comprises:
   a first dynamic D latch circuit having a clock signal input terminal to be supplied with said clock signal which is output from a predetermined one of said plurality of delay elements;
   a second dynamic D latch circuit having a clock signal input terminal to be supplied with said another clock signal which is output from another predetermined one of said plurality of delay elements;
   a first logic circuit for supplying data to a data input terminal of said first dynamic D latch circuit on the basis of output signals of said first and second dynamic D latch circuits;
   a second logic circuit for supplying data to a data input terminal of said second dynamic D latch circuit on the basis of the output signals of said first and second dynamic D latch circuits; and
   a circuit for generating the voltage to be output from said phase comparison circuit on the basis of the output signals of said first and second dynamic D latch circuits.

4. A semiconductor integrated circuit comprising:
   a delay circuit including a plurality of delay elements series-connected to each other, each having a delay time which is controlled in accordance with a voltage;
   a phase comparison circuit for comparing a phase of a clock signal and a phase of another clock signal in said delay circuit to obtain a phase difference;
   a comparison control signal generating circuit for generating a comparison control signal so as to control said phase comparison circuit to generate a predetermined voltage when said phase difference between the phase of said clock signal and the phase of said another clock signal exceeds a predetermined range;
   a filter circuit for filtering a voltage generated by said phase comparison circuit and applying said filtered voltage to said plurality of delay elements of said delay circuit; and
   a serial-parallel conversion circuit for converting serial data into parallel data by using multi-phase clock signals outputted from said plurality of delay elements.

5. A multi-phase clock generating method comprising the steps of:
   outputting multi-phase clock signals having different phases from each other;
   comparing a phase of a clock signal and a phase of another clock signal in said multi-phase clock signals to obtain a phase difference; and
   controlling a voltage to decrease a signal delay time until said phase difference between the phase of said clock signal and the phase of said another clock signal becomes equal to $2\pi$ in a case where said phase difference is greater than $2\pi$ and in a predetermined range, and controlling said voltage to increase said signal delay time until said phase difference becomes equal to 2π in a case where said phase difference is smaller than 2π and in a predetermined range;

wherein said clock signal and said another clock signal are directly compared to lock a delay-locked loop such that phase differences between phases of two adjacent clock signals included in said multi-phase clock signals become 1/N times a period of a transmission clock signal.

6. A data receiving method comprising the steps of:

outputting multi-phase clock signals having different phases from each other;

comparing a phase of a clock signal and a phase of another clock signal in said multi-phase clock signals to obtain a phase difference;

controlling a voltage to decrease a signal delay time until said phase difference between the phase of said clock signal and the phase of said another clock signal becomes equal to 2π in a case where said phase difference is greater than 2π and in a predetermined range, and controlling said voltage to increase said signal delay time until said phase difference becomes equal to 2π in a case where said phase difference is smaller than 2π and in a predetermined range; and converting serial data into parallel data by using said multi-phase clock signals phases of which are controlled.

* * * * *